(12) United States Patent
Uchida

(10) Patent No.: US 6,838,812 B2
(45) Date of Patent: Jan. 4, 2005

(54) CASE AND INTEGRATED LUMINESCENT PANEL

(75) Inventor: Masahiro Uchida, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 130 days.

(21) Appl. No.: 10/084,303

(22) Filed: Feb. 28, 2002

(65) Prior Publication Data

US 2002/0125814 A1 Sep. 12, 2002

(30) Foreign Application Priority Data

Mar. 2, 2001 (JP) ........................................ 2001-058955

(51) Int. Cl.⁷ .......................... H05B 33/10; G04B 19/30
(52) U.S. Cl. ........................ 313/483; 313/512; 368/223; 368/67

(58) Field of Search .......................... 368/67, 223, 224, 368/226, 217, 228; 313/503, 504–512, 498

(56) References Cited

U.S. PATENT DOCUMENTS

| 4,122,376 A | * 10/1978 | Mera et al. .................. 313/496 |
| 5,871,088 A | * 2/1999 | Tanabe ....................... 200/514 |
| 5,909,081 A | * 6/1999 | Eida et al. ................... 313/504 |
| 5,990,615 A | * 11/1999 | Sakaguchi et al. .......... 313/504 |

* cited by examiner

Primary Examiner—Joseph Williams
(74) Attorney, Agent, or Firm—Oliff & Berridge, PLC

(57) ABSTRACT

An organic EL panel has a cover glass as one of the components thereof. In the organic EL panel, more specifically, the cover glass, an anode, a luminescent organic layer, a cathode, a sealant, and a sealing substrate are disposed, in that order in the downward direction, to form a transparent panel.

10 Claims, 5 Drawing Sheets

CASE AND INTEGRATED LUMINESCENT PANEL

BACKGROUND OF THE INVENTION

1. Field of the Invention

The present invention relates to a technique for manufacturing electronic apparatuses comprising an organic EL panel by a simpler process.

2. Description of the Related Art

An organic EL (electroluminescence) panel, as shown in a sectional view of FIG. 5, is known as a self-luminous panel.

In this organic EL panel, as shown in FIG. 5, an anode 102 is formed on a transparent glass substrate 101 shown in lower part of the figure. An insulating layer 103 is formed on the anode 102, and a luminescent organic layer 104 including organic EL elements is formed on the anode 102 and the insulating layer 103. A cathode 105 is formed on the luminescent organic layer 104, and a sealant 106 and a sealing substrate 107 are formed on the cathode 105.

The anode 102 is a transparent electrode formed of, for example, ITO (indium tin oxide) and the cathode 105 is formed with a metallic thin film having a low work function, such as a calcium film. A direct current voltage is applied between the anode 102 and the cathode 105, so that the luminescent organic layer 104 located between the anode 102 and the cathode 105 emits light.

It is known that the contact of materials of the organic elements included in the luminescent organic layer 104 and of the cathode 105 with oxygen or water lowers the luminescent function of the organic EL layer and the conductive function of the electrode.

The luminescent organic layer 104 and the cathode 105, therefore, are disposed as thin layers between the glass substrate 101 and the sealant 106 and sealing substrate 107 which prevents the passage of oxygen and water. Hence, the glass substrate 101 and the sealant 106 and sealing substrate 107 serve to prevent oxygen and water from entering the inside of the panel.

SUMMARY OF THE INVENTION

An electronic apparatus of the present invention comprises a housing having a transparent member and a luminescent panel formed in the housing. The transparent member has electrodes on a surface thereof and is integrated with the luminescent panel.

An electronic apparatus of the present invention contains a luminescent panel, and comprises an inactive gas filling the area in which the luminescent panel is formed.

An electronic apparatus of the present invention contains a luminescent panel therein, and the area in which the luminescent panel is formed is evacuated.

DESCRIPTION OF THE PREFERRED EMBODIMENT

Figure 1:
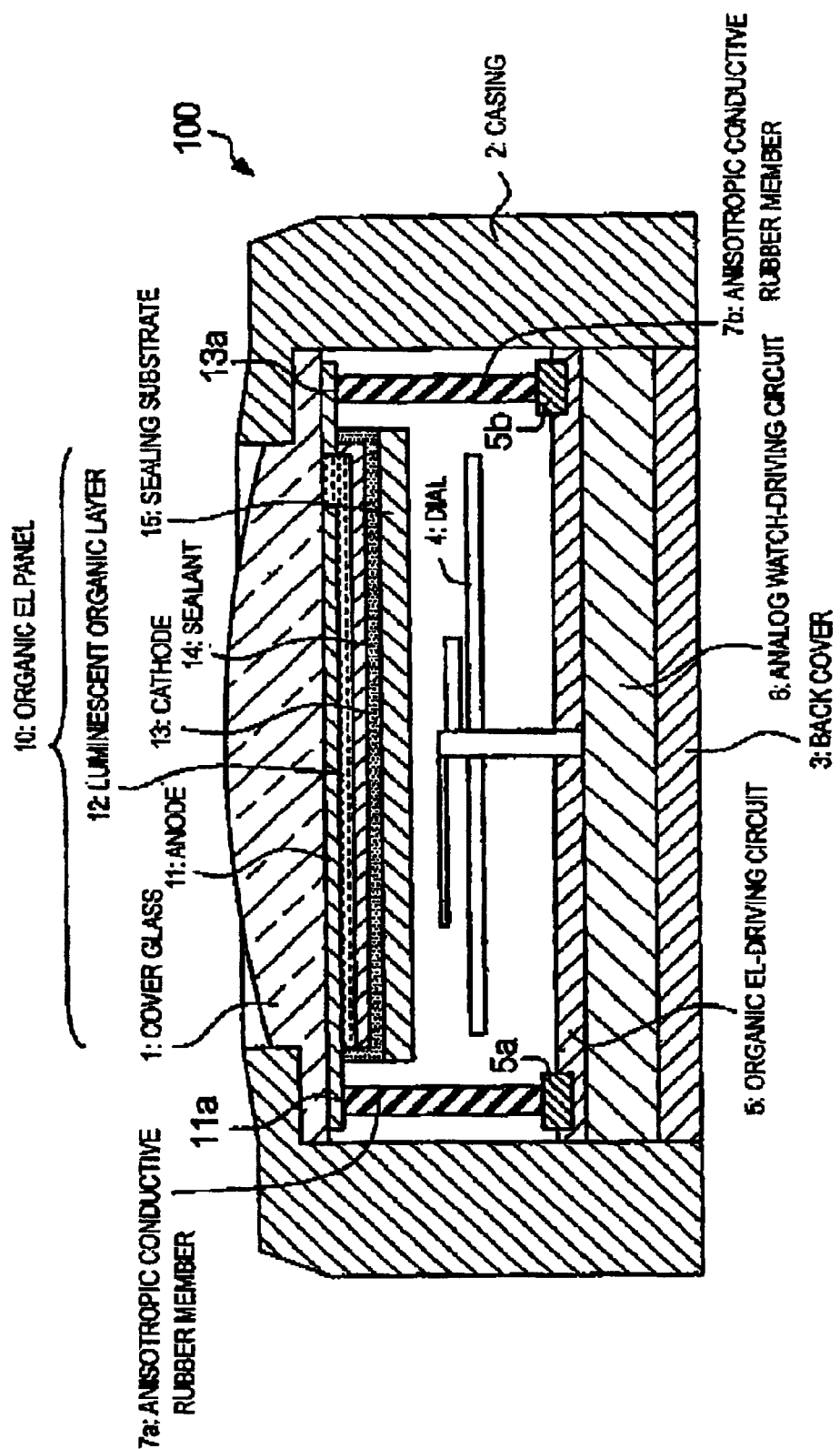
FIG. 1 is a sectional view of a wristwatch-type information apparatus according to a first embodiment of the present invention.

In order to manufacture an organic EL panel and to mount it in an electronic apparatus, conventionally, an anode, an organic layer including at least one luminescent layer, and a cathode are formed, sealed, and packed into the organic EL panel. Then, the completed organic EL panel is incorporated into the electronic apparatus. For this reason, the manufacturing process of electronic apparatuses comprising an organic EL panel is complicated.

The embodiments of the present invention are intended to solve this conventional problem, and it is an object of the present invention to provide an electronic apparatus comprising an organic EL panel which can be manufactured by a simple process.

A first constitution of the present invention is an electronic apparatus comprising a housing having a transparent member and a luminescent panel formed in the housing.

The transparent member has electrodes on one surface thereof and is integrated with the luminescent panel.

According to this constitution, the number of steps of the conventional process, in which the transparent member and the luminescent panel are each formed and incorporated into the electronic apparatus separately, can be reduced.

The luminescent panel may be a transparent panel comprising a transparent component. Thus, the transparent panel when viewed from above does not interfere with an object underlying the panel, and the object can be visible.

The transparent member may have a curved surface and the luminescent panel may be formed along the curved surface in a curved manner.

The area of the transparent member corresponding to the area not provided with luminescent elements of the luminescent panel may be treated so as not to transmit ultraviolet light.

A second constitution of the present invention comprises a luminescent panel therein.

The area provided with the luminescent panel is filled with an inactive gas.

According to this constitution, since the inactive gas fills the area provided with the luminescent panel, a manufacturing process by which the luminescent panel is protected from water and oxygen to prevent the functional deterioration of the panel can be simplified.

An electronic apparatus according to a third constitution of the present invention comprises a luminescent panel therein, and the area provided with the luminescent panel is evacuated.

According to this constitution, since the area provided with the luminescent panel is evacuated, a manufacturing process by which the luminescent panel is protected from water and oxygen to prevent the functional deterioration of the panel can be simplified.

In the second and the third constitutions, the luminescent panel may comprise a transparent flexible component.

Also, when the luminescent panel comprises the transparent flexible component, a controlling device for controlling the drive of the luminescent panel may be disposed so as to oppose a non-displaying surface of the luminescent panel.

The luminescent panel may be curved such that a surface for displaying information of the luminescent panel is convex. Electrode lead-out portions provided at ends of the luminescent panel in the curving direction may be connected to the controlling device.

Thus, the electrical resistance between the luminescent panel and the controlling device can decrease.

Preferably, the curving direction is substantially perpendicular to the longitudinal direction of the electrodes provided in the luminescent panel. This structure inhibits the bending stress caused by the curve from breaking the electrodes. Preferable embodiments will now be described with reference to drawings.

A first and a second embodiment will each describe a wristwatch-type information apparatus comprising an organic EL panel.

A: First Embodiment
A-1: Structure

FIG. 1 is a sectional view of a wristwatch-type information apparatus 100 comprising an organic EL panel according to a first embodiment of the present invention.

As shown in FIG. 1, the wristwatch-type information apparatus 100 comprises a housing comprising a cover glass 1, a casing 2, and a back cover 3. The housing contains an organic EL panel 10, a dial 4, an organic EL-driving circuit 5, and an analog watch-driving circuit 6.

The cover glass 1 also serves as one of the components of the organic EL panel 10. In the organic EL panel 10, more specifically, the cover glass 1, an anode 11, an insulating layer (not shown in the drawing), a luminescent organic layer 12, a cathode 13, a sealant 14, and a sealing substrate 15 are disposed, in that order in the downward direction of the drawing, to form a transparent panel. The anode 11 is formed of a transparent and conductive material such as ITO and the cathode 13 is formed with a metallic thin film having a low work function, such as a calcium film, a magnesium film, or an aluminum film. The anode 11 and the cathode 13 have electrode lead-out portions 11a and 13a to which voltage is applied and which are each in contact with an anisotropic conductive rubber member 7a or 7b. Each anisotropic conductive rubber member 7a or 7b is connected with a terminal 5a or 5b of the organic EL-driving circuit 5.

The luminescent organic layer 12 comprises a conductive polymer layer serving as a hole injection layer formed of, for example, Baytron P Al 4083 produced by Bayer AG and a luminescent polymer having a π-conjugation, such as polyfluorene or polyparaphenylene vinylene, deposited on the conductive polymer layer.

The organic EL-driving circuit 5 applies a direct-current voltage between the anode 11 and the cathode 13 of the organic EL panel 10 through the anisotropic conductive rubber members 7a and 7b, according to character data transmitted from a microprocessor, which is not shown in the drawing. Thus, the organic EL panel 10 displays various types of information expressed by the characters.

The analog watch-driving circuit 6 counts the number of clock pulses according to a clock signal transmitted from an oscillating circuit, which is not shown in the drawing, and drives an hour hand, a minute hand, and a second hand on the dial 4 according the counted number.

Since the organic EL panel 10 is transparent, the organic EL panel 10 when viewed by a user of the wristwatch type-information apparatus 100 does not interfere with the dial 4, which lies thereunder and indicates time, when nothing is displayed on the organic EL panel 10; hence, the time-display is visible. Also, when the organic EL panel 10 displays information, not only the information but also a practical time-display on the dial 4 can be seen.

A-2: Manufacturing Method

A method of manufacturing the organic EL panel 10 illustrated above will now be described.

First, the internal surface of the cover glass 1 (the surface opposing the dial 4) is planarized and smoothed, and then is adequately cleaned. The purpose of these pre-treatments is to prevent the contamination with water, oxygen, and other impurities in a process of forming the anode 11 and others described below.

Next, an anode layer is formed of ITO or the like on the cover glass 1 given the pre-treatments by, for example, vacuum deposition. The anode layer is patterned into a predetermined shape by etching or the like to form the anode 11 and the electrode lead-out portion 11a.

Next, an insulating layer is formed on the internal surface of the cover glass 1 by spin coating or the like. The insulating layer is formed outside of the luminescent area by photo etching or the like.

Next, the luminescent organic layer 12 is formed, by a spin coating, an ink jet, or another method, on the anode 11 and the insulating layer formed on the cover glass 1. The solution used in this process is prepared by dissolving the conductive polymer material described above and a luminescent polymer material according to the color in a solvent such as water, xylene, toluene, tetrahydrofuran, mesitylene, tetralin, or dioxane.

Next, a cathode 13 is patterned into a predetermined shape on the luminescent organic layer 12 by, for example, vapor deposition or sputtering with a mask, and concurrently the electrode lead-out portion 13a of the cathode 13 are formed.

Finally, the cathode 13 is coated with the sealant 14 and then is provided with the sealing substrate 15 to cover the entire luminescent area.

The completed organic EL panel 10 is incorporated into the casing 2 of the wristwatch-type information apparatus 100 in the same manner as a conventional cover glass is incorporated. Then, the electrode lead-out portion 11a of the anode 11 and the electrode lead-out portion 13a of the cathode 13 are each connected with the anisotropic conductive rubber member 7a or 7b.

According to the first embodiment described above, by using the cover glass 1 of the wristwatch-type information apparatus 100 comprising an organic EL panel as a transparent glass to cover the displaying surface of the panel, the cover glass 1 and the organic EL panel 10 can be integrated with each other.

Thus, the number of steps of the conventional process, in which a cover glass and an organic EL panel are each formed and incorporated into the wristwatch-type information apparatus 100 separately, can be reduced.

Also, the transparent glass, which is required for conventional EL panels, is not necessary, and therefore the wristwatch-type information apparatus 100 becomes thinner and lighter and manufacturing costs of the wristwatch-type information apparatus 100 can be reduced.

A-3: Modification of First Embodiment
(1) Shape of the Cover Glass 1

Although the cover glass 1 is plane in the first embodiment, it is not limited to such a shape and may be curved. In this instance, the organic EL panel 10 is formed along the curved internal surface of the cover glass 1.

(2) Cover Glass Protection Against Ultraviolet Light

The upper area of the cover glass 1 where the luminescent organic layer 12 of the organic EL panel 10 is not formed may be treated so that ultraviolet light cannot be transmitted. Thus, the luminescent organic layer 12 is protected as much as possible from deterioration by ultraviolet light.

(3) Connection of the Anode 11 and the Cathode 13

The anode 11 and the cathode 13 are connected to the terminals 5a and 5b of the organic EL-driving circuit 5 by the anisotropic conductive rubber members 7a and 7b in the first embodiment. However, the connecting material is not limited to such an anisotropic conductive rubber, and other mounting tapes may be used for connection.

(4) Devices in which the Panel is Mounted

The organic EL panel 10 is mounted in a wristwatch-type information apparatus 100 in the first embodiment, but it is not limited to this. The organic EL panel 10 may be mounted in various electronic apparatuses including communication equipment such as cellular telephones, music-reproducing apparatuses such as MP3 players, and information terminals such as PDAs and personal computers.

The time-display of the wristwatch-type information apparatus 100 may be analog or digital. In the case of digital time-display, the dial 4 shown in FIG. 1 is replaced with a liquid crystal panel or an EL panel for indicating time.

B: Second Embodiment

B-1: Structure

Figure 2:
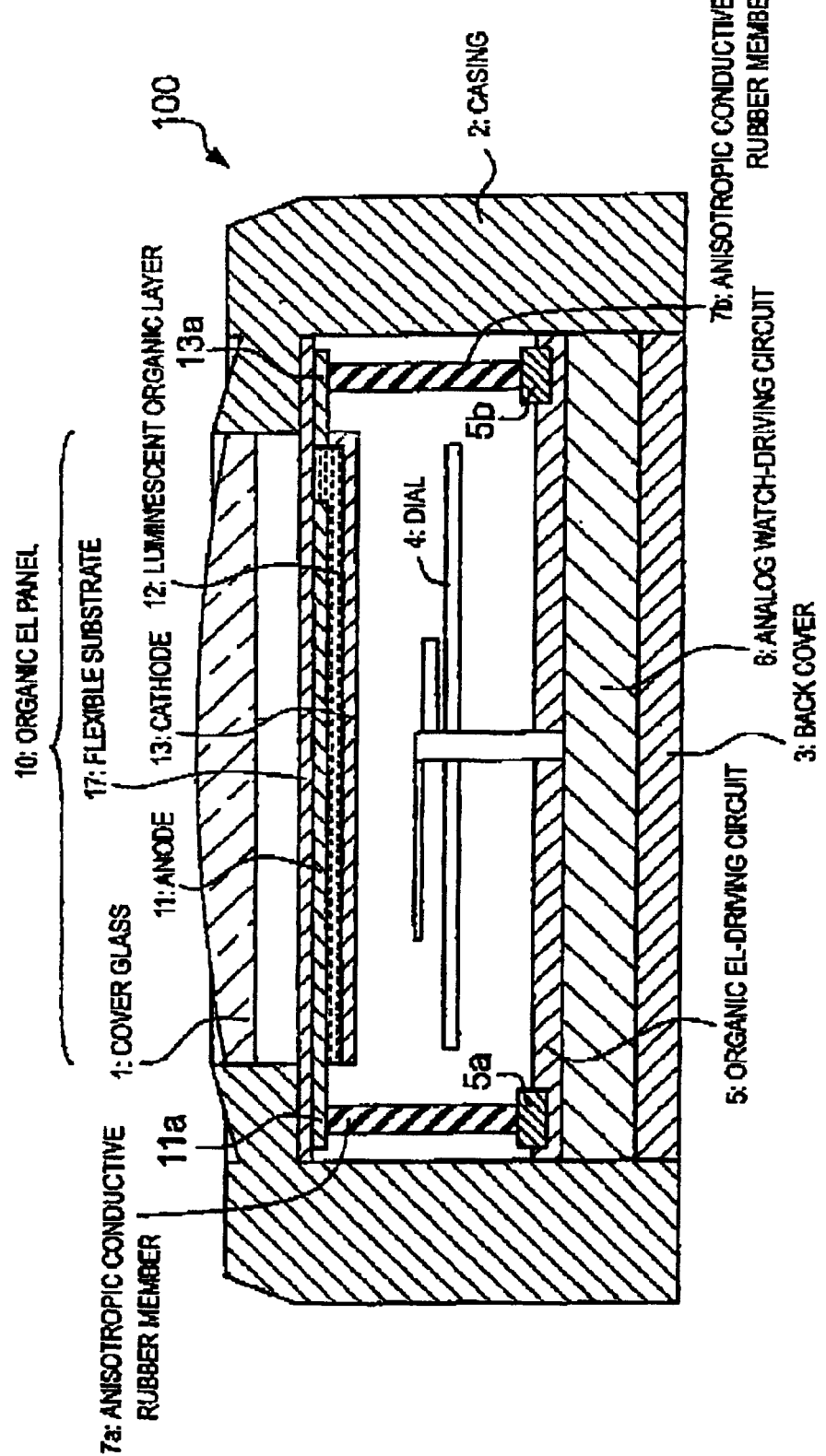
FIG. 2 is a sectional view of a wristwatch-type information apparatus according to a second embodiment of the present invention.

FIG. 2 is a sectional view of a wristwatch-type information apparatus 100 comprising an organic EL panel according to a second embodiment of the present invention.

As shown FIG. 2, the wristwatch-type information apparatus 100 comprises the housing comprising the cover glass 1, the casing 2, and the back cover 3. The housing contains an organic EL panel 10, the dial 4, the organic EL-driving circuit 5, and the analog watch-driving circuit 6. The housing is filled with an inactive gas (in this embodiment, nitrogen gas), and is hermetically sealed so that the inactive gas does not leak outside.

In the organic EL panel 10, a transparent flexible substrate 17, the conductive anode 11 formed of, for example, ITO, the insulating layer (not shown in the drawing), the luminescent organic layer 12, the cathode 13 formed with a metallic thin film having a low work function, such as a calcium film, are disposed, in that order in the downward direction of the drawing, to form a transparent panel.

The second embodiment is different from the first embodiment in that the flexible substrate 17 exclusively used for the organic EL panel 10 is used instead of the cover glass 1, that the sealant 14 and the sealing substrate 15 are not used, and that the housing is filled with an inactive gas. Other components are the same as the first embodiment and details are omitted.

In the second embodiment, since the housing of the wristwatch-type information apparatus 100 is filled with an inactive gas to exclude water and oxygen, it is not necessary to take into account the functional deterioration arising from water and oxygen.

Hence, the sealant and the sealing substrate, which are conventionally required, are not necessary, and therefore the number of steps of the manufacturing process and the manufacturing cost can be reduced.

Although the flexible substrate 17 is thought to be more permeable to water and oxygen than the transparent glass, it can be used as the surface of the organic EL panel 10 to contribute to weight reduction of the wristwatch-type information apparatus 100.

B-2: Manufacturing method

A method of manufacturing the organic EL panel 10 illustrated above will now be described.

First, an anode layer is formed of ITO or the like on the cleaned flexible substrate 17 by, for example, vacuum deposition. Then, the anode layer is patterned into a predetermined shape by, for example, etching to form the anode 11 and the electrode lead-out portion 11a.

Next, an insulating layer is deposited, by spin coating or the like, on the side of the flexible substrate 17 on which the anode 11 is formed. The insulating layer is formed outside of the luminescent area by photo etching or the like.

Next, the luminescent organic layer 12 is formed, by a spin coating, an ink jet, or another method, on the anode 11 and the insulating layer formed on the flexible substrate 17.

Next, a cathode 13 and the electrode lead-out portion 13a of the cathode 13 are formed into a predetermined pattern on the luminescent organic layer 12 by, for example, vapor deposition or sputtering with a mask.

The completed organic EL panel 10 is incorporated into the wristwatch-type information apparatus 100, and then the electrode lead-out portion 11a of the anode 11 and the electrode lead-out portion 13a of the cathode 13 are connected with each anisotropic conductive rubber member 7a or 7b.

According to the second embodiment described above, by filling the housing with the inactive gas, other components for protecting the inside of the panel from water and oxygen can be eliminated.

Also, by using a flexible substrate instead of a transparent glass, the wristwatch-type information apparatus 100 can be made light, and the risk of the flexible substrate 17 being broken if the apparatus 100 is dropped can be reduced.

In addition, a sealant and a sealing substrate are not necessary, and therefore the apparatus 100 becomes light and the number of the steps of the manufacturing process and the manufacturing cost of the wristwatch-type information apparatus 100 can be reduced.

B-3: Modification of Second Embodiment (1) Interior of the Housing

The housing of the wristwatch-type information apparatus 100 is filled with an inactive gas in order to eliminate components for the protecting the inside of the panel from water and oxygen in the second embodiment. Nitrogen, argon, or the like may be used as this inactive gas.

Alternatively, an evacuated housing may be used for the wristwatch-type information apparatus 100 to exclude water and oxygen as effectively as the above.

(2) Shape of the Organic EL Panel

Although a flat organic EL panel is used in the second embodiment, the organic EL panel is not limited to this shape and may be curved.

Figure 3:
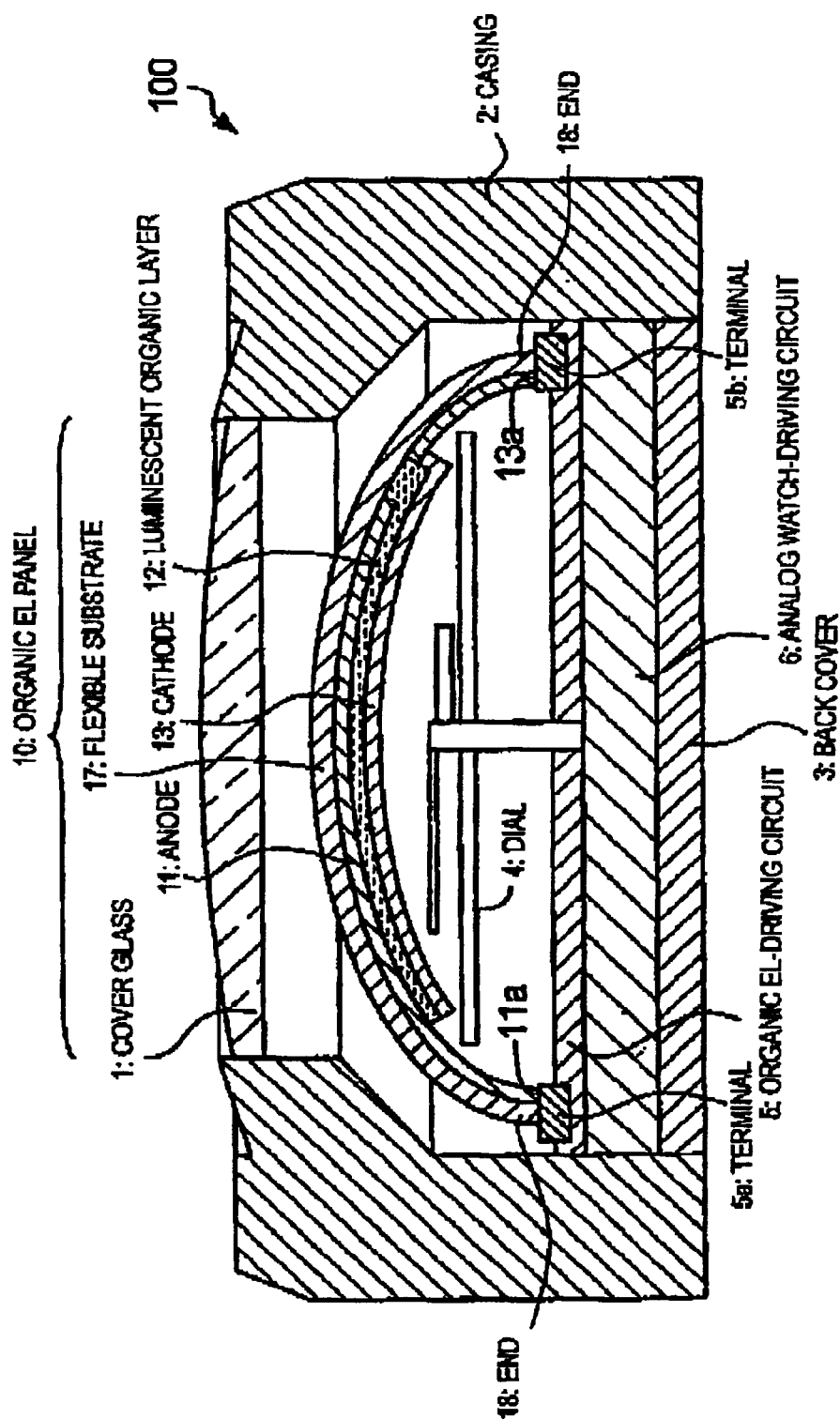
FIG. 3 is a sectional view of a wristwatch-type information apparatus according to a modification of the second embodiment of the present invention.
Figure 4:
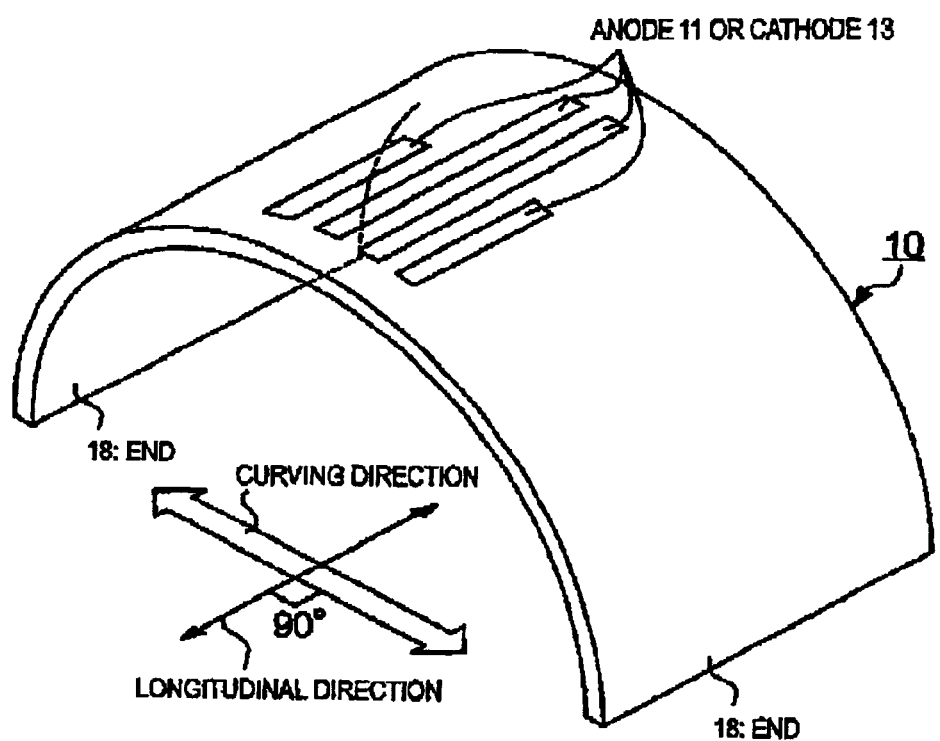
FIG. 4 is an oblique perspective view of an organic EL panel according to the modification.
Figure 5:
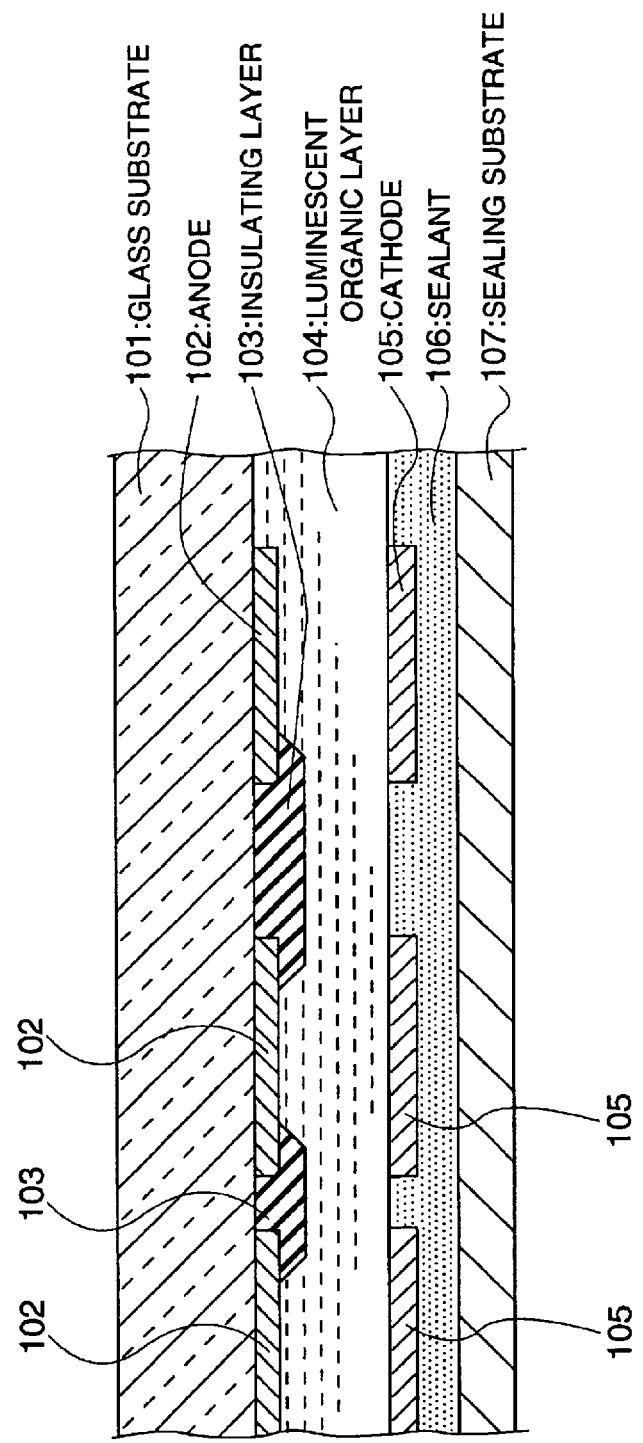
FIG. 5 is a sectional view of a known organic EL panel.

An exemplary curved organic EL panel 10 is shown in a sectional view of FIG. 3 and in a perspective view of FIG. 4. As shown in FIG. 3, the organic EL panel 10 is curved such that the display surface side (upper side in the drawing) thereof is convex. Ends 18 of the organic EL panel 10 in the curving direction (see FIG. 4) are provided with the electrode lead-out portion 11a of the anode 11 and the electrode lead-out portion 13a of the cathode 13. The electrode lead-out portions 11a and 13a are directly connected to the terminals 5a and 5b of the organic EL-driving circuit 5 located in the non-display surface side (lower side in the drawing) of the organic EL panel 10.

As a result, the electrical resistance between the organic EL panel 10 and the organic EL-driving circuit 5 is low compared to the case when the anisotropic conductive rubber member 7 is used, and therefore the power consumption can be lower.

Preferably, as shown in FIG. 4, the curving direction of the organic EL panel 10 is perpendicular to the longitudinal direction of the anode 11 and the cathode 13. This structure inhibits as much as possible the bending stress caused by the curve from breaking the anode 11 and the cathode 13.

(3) Connection of the Anode 11 and the Cathode 13

The anode 11 and the cathode 13 are connected to the organic EL-driving circuit 5 by the anisotropic conductive rubber member 7a and 7b in the second embodiment. However, the connecting material is not limited to such an anisotropic conductive rubber member, and other mounting tapes may be used for the connection.

(4) Devices in which the Panel is Mounted

The organic EL panel 10 is mounted in the wristwatch-type information apparatus 100 in the second embodiment, but it is not limited to this. The organic EL panel 10 may be mounted in various electronic apparatuses including communication equipment such as cellular telephones, music-reproducing apparatuses such as MP3 players, and information terminals such as PDAs and personal computers.

According to the present invention, by providing electrodes for applying voltage to the luminescent panel on the internal surface of the transparent member of the housing of an electronic apparatus, the transparent member and the luminescent panel can be integrated, so that the manufacturing process is simplified.

According to the present invention, by filling the area in which the luminescent panel is contained with an inactive gas, the process by which the luminescent panel is protected from water and oxygen to prevent the functional deterioration of the panel can be simplified.

According to the present invention, by evacuating the area in which the luminescent panel is contained, the process by which the luminescent panel is protected from water and oxygen to prevent the functional deterioration of the panel can be simplified.

What is claimed is:

1. An electronic apparatus, comprising:
   a case having a transparent member that defines one surface;
   a luminescent panel formed in the case, the transparent member having electrodes over the one surface and being integrated with the luminescent panel; and
   a display means formed in the case, the display means being overlapped with the luminescent panel.

2. The electronic apparatus according to claim 1,
   the luminescent panel being a transparent panel that includes a transparent component.

3. The electronic apparatus according to claim 1,
   the luminescent panel defining an area that is not provided with luminescent elements, the transparent member defining an area corresponding to the area of the luminescent panel that is not provided with luminescent elements, the area of the transparent member being treated so as not to transmit ultraviolet light.

4. An electronic apparatus according to claim 1,
   the case being filled with an inactive gas.

5. An electronic apparatus according to claim 1,
   the case being evacuated.

6. The electronic apparatus according to claim 4, further comprising:
   a controller that controls the drive of the luminescent panel, opposing a non-display surface of the luminescent panel,
   the luminescent panel being curved such that a surface that displays information of the luminescent panel is convex, and the electrode lead-out portions provided at ends of the luminescent panel in the curving direction being connected to the controller.

7. The electronic apparatus according to claim 6,
   the curving direction being substantially perpendicular to the longitudinal direction of the electrodes provided in the luminescent panel.

8. The electronic apparatus according to claim 1,
   the transparent member having a curve surface, and the luminescent panel being formed along the curved surface of the transparent member in a curved manner.

9. The electronic apparatus according to claim 8,
   each end of the luminescent panel having an electrode lead-out portion that is directly connectable to a terminal of a controller.

10. The electronic apparatus according to claim 1,
    the display means is a time-display.

* * * * *